(12) United States Patent
Koch et al.

(10) Patent No.: US 8,993,119 B2
(45) Date of Patent: Mar. 31, 2015

(54) PROCESS FOR PRODUCING A CORROSION-PROTECTED AND HIGH-GLOSS SUBSTRATE

(75) Inventors: Matthias Koch, Bromskirchen (DE); Guido Wübbeling, Frankenberg (DE)

(73) Assignee: Ropal Europe AG, Allendorf/Eder (DE)

( * ) Notice: Subject to any disclaimer, the term of this patent is extended or adjusted under 35 U.S.C. 154(b) by 749 days.

(21) Appl. No.: 12/295,188

(22) PCT Filed: Apr. 17, 2007

(86) PCT No.: PCT/EP2007/003377
§ 371 (c)(1),
(2), (4) Date: Jul. 20, 2009

(87) PCT Pub. No.: WO2007/121898
PCT Pub. Date: Nov. 1, 2007

(65) Prior Publication Data
US 2010/0075172 A1    Mar. 25, 2010

(30) Foreign Application Priority Data

Apr. 19, 2006 (EP) .................................. 06008081

(51) Int. Cl.
C23C 14/34 (2006.01)
C23C 14/00 (2006.01)
(Continued)

(52) U.S. Cl.
CPC ............. C23C 14/165 (2013.01); C23C 14/021 (2013.01); C23C 14/024 (2013.01); C23C 14/5806 (2013.01); C23C 22/34 (2013.01); *Y02T 50/67* (2013.01)
USPC ........... 428/650; 428/457; 428/336; 428/432; 428/464; 428/469; 428/615

(58) Field of Classification Search
None
See application file for complete search history.

(56) References Cited

U.S. PATENT DOCUMENTS 2,825,697 A    3/1958 Carroll
2,928,763 A    3/1960 Russell
(Continued)

FOREIGN PATENT DOCUMENTS

CA    2 162 473 A1    11/1994
CA    2 644 789 A1    9/2007
(Continued)

OTHER PUBLICATIONS

Canadian Office Action, issued in related Canadian Application No. 2635713, filed Jun. 27, 2008, 2 pages.
(Continued)

*Primary Examiner* — Vera Katz
(74) *Attorney, Agent, or Firm* — Christensen O'Connor Johnson Kindness PLLC (57) ABSTRACT

A coated substrate that is at least partially corrosion protected is described. The coated substrate includes (a) a substrate and (b) at least one metal layer provided on the substrate, the metal layer having (i) a first metal that is aluminum, lead, vanadium, manganese, magnesium, iron, cobalt, nickel, copper, titanium, or zinc; or (ii) a first metal alloy that is brass, bronze, stainless steel, magnesium alloy, titanium alloy, or aluminum alloy; and wherein at least one oxide, double oxide, oxide hydrate, or oxyhalogenide of a second metal selected from the group consisting of zirconium, titanium, and hafnium is embedded in the metal layer; and wherein the metal layer has a thickness in the range of 20 nm to 120 nm.

14 Claims, 7 Drawing Sheets

(51) Int. Cl.
- *C23C 14/26* (2006.01)
- *B05D 3/00* (2006.01)
- *B05D 1/36* (2006.01)
- *B32B 15/04* (2006.01)
- *B32B 15/12* (2006.01)
- *B32B 15/00* (2006.01)
- *B32B 15/10* (2006.01)
- *B32B 15/20* (2006.01)
- *C23C 14/16* (2006.01)
- *C23C 14/02* (2006.01)
- *C23C 14/58* (2006.01)
- *C23C 22/34* (2006.01)

(56) References Cited

U.S. PATENT DOCUMENTS

| | | | |
|---|---|---|---|
| 4,391,652 A | 7/1983 | Das | |
| 4,422,886 A | 12/1983 | Das | |
| 5,073,403 A | 12/1991 | Kagechika | |
| 5,143,562 A | 9/1992 | Boulos | |
| 5,584,946 A | 12/1996 | Karmaschek | |
| 5,922,478 A | 7/1999 | Welty | |
| 5,989,730 A | 11/1999 | Sugg | |
| 6,068,890 A | 5/2000 | Kaumle | |
| 6,087,017 A * | 7/2000 | Bibber | 428/458 |
| 6,562,148 B1 | 5/2003 | Wendel | |
| 6,875,479 B2 | 4/2005 | Jung | |
| 6,896,920 B1 | 5/2005 | Forman | |
| 6,896,970 B2 | 5/2005 | Mayzel | |
| 7,452,428 B2 * | 11/2008 | Koch et al. | 148/274 |
| 2002/0160180 A1 | 10/2002 | Yamamoto | |
| 2004/0020565 A1 | 2/2004 | Melzer | |
| 2004/0022950 A1 * | 2/2004 | Jung et al. | 427/385.5 |
| 2004/0043907 A1 | 3/2004 | Bischoff | |
| 2004/0244874 A1 | 12/2004 | Nakayama | |
| 2005/0067056 A1 * | 3/2005 | Shoji et al. | 148/273 |
| 2005/0115839 A1 | 6/2005 | Dolan | |
| 2006/0014893 A1 * | 1/2006 | Koch et al. | 524/800 |
| 2006/0127681 A1 | 6/2006 | Domes | |
| 2009/0068480 A1 * | 3/2009 | Koch et al. | 428/457 |

FOREIGN PATENT DOCUMENTS

| | | | |
|---|---|---|---|
| CN | 1516751 A | 7/2004 | |
| DE | 43 17 217 A1 | 1/1994 | |
| DE | 19702566 A1 | 2/1998 | |
| DE | 10049005 A1 | 5/2002 | |
| DE | 10149148 A1 | 5/2002 | |
| DE | 10210269 A1 | 9/2003 | |
| DE | 10332744 A1 | 2/2005 | |
| DE | 60200458 T2 | 12/2005 | |
| DE | 601 27 921 T2 | 12/2007 | |
| EP | 0178020 A1 | 4/1986 | |
| EP | 1 206 977 A2 | 5/2002 | |
| EP | 1 200 641 B1 | 12/2003 | |
| EP | 1455001 A1 | 9/2004 | |
| GB | 2165165 A | 4/1986 | |
| JP | 56-081695 A | 3/1981 | |
| JP | 61-064887 A | 4/1986 | |
| JP | 5-150105 A | 6/1993 | |
| JP | 2000-150216 A | 5/2000 | |
| JP | 2002-144474 A | 5/2002 | |
| JP | 2002-2144474 A | 5/2002 | |
| JP | 2002-274101 A | 9/2002 | |
| WO | 01/51681 A2 | 7/2001 | |
| WO | 2004/014646 A1 | 2/2004 | |
| WO | WO2004055238 A1 * | 7/2004 | C23C 22/36 |
| WO | 2005/061761 A1 | 7/2005 | |
| WO | 2006/022589 A1 | 3/2006 | |

OTHER PUBLICATIONS

Notice of Reasons for Rejection (JP), mailed May 14, 2013, issued in related Japanese Application No. 2009-505768, filed Apr. 17, 2007, 6 pages.

European Office Action mailed Jan. 2, 2012, issued in corresponding European Application No. EP 06 008 081.9, filed Apr. 19, 2006, 12 pages (with English summary).

Lunder, O., "Chromate-Free Pre-Treatment of Aluminium for Adhesive Bonding," doctoral dissertation, Norwegian University of Science and Technology, Trondheim, Norway, May 2003, 144 pages.

* cited by examiner

PROCESS FOR PRODUCING A CORROSION-PROTECTED AND HIGH-GLOSS SUBSTRATE

FIELD

The invention relates to a method for producing a corrosion protected and in particular, very shiny metallic or non-metallic substrate, together with a corrosion protected and in particular, very shiny metallic or non-metallic substrate and its utilisation.

BACKGROUND

The visual refinement of any substrates, with which these substrates are given a metallic effect, has been known for a long time. Here, layers which are very different from each other are applied in a range of different sequences to the substrate, wherein said layers comprise at least one metallic layer. Essential requirements for substrates which are coated with a metallic layer are excellent corrosion resistance and a pleasing visual appearance, by means of which the coated substrates appear to be fully metallic or chrome-plated substrates, for example. Of particular importance are coated substrates in the automobile industry, for example, when manufacturing wheels or wheel rims, in particular light metal wheels or light metal wheel rims, for which a shiny, chrome appearance is required.

A method is known for example from the prior art with which light metal wheel rims are galvanically chrome-plated. With this method, a chrome layer, which is only several thousandths of a millimeter thick, is applied to a light metal wheel rim. In order to avoid reproducing all the unevennesses of the substrate surfaces, the wheel rims must therefore be ground, shiny polished and thoroughly prepared before the galvanic coating process. Otherwise, all pores, scratches and unevennesses can clearly be seen on the coated wheel rim. The grinding, shiny polishing and preparation of the substrate are very complex and require a great amount of work, regardless of the geometry of said substrate. Furthermore, the galvanic process is as such laborious in terms of work safety, and can harm the environment if it is not conducted correctly. As soon as the galvanically applied chrome surface is damaged, the known contact corrosion occurs. Under the influence of, e.g., rainwater or snow melt water, which generally contains dissolved road salt, an electric voltage series is created between the more precious part (in this case, chrome as the covering layer) and the less precious metal of the substrate (such as an aluminium or magnesium alloy). Here, the less precious metal disintegrates. As a result, e.g., a wheel rim can in an unfavourable case be severely damaged when intercrystalline corrosion occurs, which can then lead to a critical effect on both the visual appearance and the stability levels of the wheel rim under dynamic load during use. It is furthermore of disadvantage with the galvanic chrome plating process that the galvanically applied chrome layer more frequently comprises other expansion coefficients than the substrate material which lies beneath it. As a result, tensions can occur which lead to fissures or even flaking.

Coating methods are also known from the prior art in which chrome is deposited onto a wheel rim by cathode spraying (sputtering) in a high vacuum. The method is conducted under high electric voltage. A light metal wheel rim which is coated using the sputtering method does not however usually have the same visual appearance as a galvanically chrome-coated wheel rim, i.e., rather than being metallic and shiny, it has the appearance of black chrome, and as a result has a darker surface which is by no means of the same value as a galvanically coated chrome surface. So-called "black chrome surfaces" are unacceptable, e.g., for all shiny sanitary items. Furthermore, a light metal wheel rim which has been manufactured using the sputter chrome coating method does not meet the test requirements which are specified as a minimum standard by the automobile industry, such as the grid cut test according to DIN EN ISO 2409, the salt spray test (copper chloride/acetic acid) according to DIN 50021-CASS(240h), the condensation water constant climate test according to DIN 50017 KK and the chemical resistance test according to VDA 621-412.

A method for the strong adhesive coating of a substrate is known from DE 102 10 269 A1, in order to give said substrate a metallic appearance, wherein initially a base coat layer is applied to the substrate and is dried, and the base coat layer is then treated with an inorganic bonding agent. A silver layer is then applied. Finally, the applied layers are coated with a protective lacquer. With the substrates coated using this method, an oxidation of the silver layer occurs relatively rapidly through the protective lacquer which is not completely sealed. This leads to a loss of adhesion of the silver layer from the substrate, and finally to a yellow discoloration.

In order to achieve sufficient corrosion protection of metal parts, coatings which contain chrome, also known as conversion layers, are frequently applied. Due to the light yellow iridescent effect of coatings of this type, the process is also referred to as yellow alodining. In contrast to anodically applied protective coatings, chromate conversion coatings no longer provide regular protection as soon as the surface is scratched. Alodined surfaces can be obtained by means of the immersion method or the injection/spray method. An example of the application of chromate protective layers can be found in U.S. Pat. No. 2,825,697 and U.S. Pat. No. 2,928,763. The application of a conventional conversion layer on a chrome base is also given, for example, in WO 2004/014646 A1.

A modified chromate coating is given in WO 01/51681 A2, according to which a suitable passivation solution must contain chromium(III) chloride and sodium nitrate.

In DE 197 02 566 C2, the method for shine coating motor vehicle parts is finally modified with the aid of a chromate layer to the extent that a very shiny layer made of a metal is applied in a vacuum to a powder lacquer layer present on the chromate layer using a magnetron. By means of this method, colour effects can be systematically created without the necessity of adding external pigments.

It is furthermore known from WO 01/51681 A2 and DE 602 00 458 T2 that metal layers can be made resistant to corrosion not only by means of treatment with a chromate which contains a passivation or conversion solution, but that for this purpose, metal phosphate coatings which do not dissolve easily such as coatings with a zinc or iron phosphate base can also be used.

For the chrome-free surface treatment, according to DE 103 32744 A1, an aqueous mixture containing an at least partially hydrolysed, fluorine-free silane and an at least partially hydrolysed silane which contains fluorine can also be used.

According to DE 602 00 458 T2, sufficient corrosion resistance can be achieved in that the corrosion protection coat contains a metallic zinc powder and at least one metal salt rust inhibitor, wherein this metal salt is based on magnesium, aluminium, calcium and barium, and has an average diameter size of no more than 1 μm. The metal in the metal salt must be more alkaline than zinc.

Good corrosion protection is achieved according to DE 100 49 005 A1 when the method stage of the treatment with a passivation agent occurs simultaneously with the application of a lubricant. The prerequisite for this is that the agent which contains lubricant does not essentially consist of titanium or/and zirconium and fluoride and a polymer. This new development essentially makes use of long-chain molecule residues which, as is known from surface active substances such as tensides, tend towards self-assembly. Accordingly, this technology is also known as SAM coating (Self Assembling Molecules).

A chrome-free surface coating of metals, which can be applied at high coating speeds, is according to DE 101 49 148 A1 based on an aqueous composition which contains an organic film creating agent which contains at least one polymer which does not dissolve easily or which is dispersed in water, with an acid value in the region of between 5 and 200, at least one inorganic connection in particle form with an average particle diameter in the range of between 0.005 and 0.3 μm and at least one lubricant, wherein the dried film which is applied comprises a layer thickness in the region of between 0.01 to 10 μm, a pendulum strength of between 50 and 180 s and a flexibility which prevents fissures longer than 2 mm from occurring when bent over conical pin in accordance with DIN ISO 6860. Synthetic resins based on acrylates, butadienes, ethyls, polyester, polyurethane, silicon polyesters, epoxy resins, phenol, styrol and urine formaldehyde are suitable for use as organic film creation agents.

U.S. Pat. No. 6,896,920 B2 discloses a multi-layer shiny coat with which initially, a polymer layer is to be applied to a metallic substrate surface. Then, this polymer coating is supplemented by a metal layer. An inorganic layer which prevents corrosion is then applied to this metal layer. The final, top layer of this multi-layer system is a transparent protective lacquer layer. Although it is identified as preventing corrosion, with the multi-layer substrates in accordance with U.S. Pat. No. 6,896,920 B2, with the CASS salt spray mist test, a corrosion-related change in the surface is determined after just 168 hours. The automobile industry regularly demands evidence of an unchanged surface even after 240 hours, however.

SUMMARY

In one aspect, a coated substrate that is at least partially corrosion protected is provided. The coated substrate comprises (a) a substrate and (b) at least one metal composite corrosion protective layer provided on the substrate. The metal composite protective layer consists of (i) a first metal that is aluminium, lead, vanadium, manganese, magnesium, iron, cobalt, nickel, copper, titanium, or zinc; or (ii) a first metal alloy that is brass, bronze, stainless steel, magnesium alloy, titanium alloy, or aluminium alloy; and (iii) at least one oxide, double oxide, oxide hydrate, or oxyhalogenide of a second metal selected from the group consisting of zirconium, titanium, and hafnium is distributed within the metal composite protective layer.

The metal composite protective layer has a thickness in the range of 20 nm to 120 nm. Providing the at least one metal composite corrosion protective layer comprises (a) providing a metal layer consisting of the first metal or the first metal alloy by Physical Vapour Deposition (PVD) coating, vaporisation using an electron steam vaporiser, vaporisation using a resistance vaporiser, induction vaporisation, ARC vaporisation, and/or cathode spraying (sputter coating); and (b) incorporating the at least one oxide, double oxide, oxide hydrate, or oxyhalogenide of the second metal into the metal layer by treating the metal layer with an aqueous system comprising at least one acid, oxide, double oxide, oxide hydrate, oxyhalogenide or salt of the second metal.

In at least one embodiment, a surface of the substrate that bears the metal composite protective layer is an at least partially polished, ground, de-greased, or pickled surface.

In at least one embodiment, the oxide, double oxide, oxide hydrate, or oxyhalogenide of the second metal in the metal composite protective layer, in relation to its overall weight, lies in the range of 0.2% to 10% by weight.

In at least one embodiment, the thickness of the metal composite protective layer lies in the range of 20 nm to 100 nm. In one embodiment, the thickness of the metal composite protective layer lies in the range of 50 nm to 120 nm.

In at least one embodiment, the substrate is formed from metals, precious metals or metal alloys, glass, ceramic, carbon materials, plastic material, wood, or chipboard.

In at least one embodiment, oxidically bound titanium, zirconium, hafnium, or a mixture thereof is present in the metal composite protective layer. In at least one embodiment, the oxide, double oxide, oxide hydrate, or oxyhalogenide of the second metal selected from the group consisting of zirconium, titanium, and hafnium is distributed in the metal composite protective layer over essentially the entire thickness of the metal composite protective layer of the first metal or the first metal alloy. In at least one embodiment, the oxide, double oxide, oxide hydrate, or oxyhalogenide of the second metal selected from the group consisting of zirconium, titanium, and hafnium is essentially evenly distributed in the metallic composite protective layer.

In at least one embodiment, the substrate is an aluminium substrate, and the metal composite protective layer is an aluminium layer in which oxidically bound titanium, zirconium, hafnium, or a mixture thereof is distributed. In at least one embodiment, the substrate is an aluminium substrate, and the metal composite protective layer comprises an aluminium layer in which zirconium dioxide is present and substantially evenly distributed.

In at least one embodiment, a cover lacquer layer or glaze is applied directly on the metal composite protective layer.

In at least one embodiment, the coated substrate further comprises at least one base coat layer intermediate the substrate and the metal composite protective layer.

In at least one embodiment, the metal layer is provided by Physical Vapour Deposition (PVD) coating, vaporisation using an electron stream vaporiser, vaporisation using a resistance vaporiser, induction vaporisation, ARC vaporisation, and/or cathode spraying (sputter coating), in each case in a high vacuum.

BRIEF DESCRIPTION OF THE DRAWINGS

Features and advantages of the invention are included in detail in the following description, and in the exemplary embodiments of the invention with reference to schematic drawings, in which.

DETAILED DESCRIPTION

An object of the present invention is to provide a method for producing corrosion-protected and in particular, very shiny substrates and corrosion-protected substrates which are created according to this method, which overcomes or overcome the disadvantages of the prior art. An object of the invention is in particular to make available a method with which corrosion-protected substrates are accessible which are extremely corrosion-resistant even under mechanical load or following damage over a longer period of time, and which show or contain a very attractive visual appearance as is commonly obtained at best with galvanic chrome-plating.

This object is attained according to the invention by means of a method for producing an at least partially corrosion-protected, in particular shiny, metallic and/or non-metallic substrate, comprising a) the provision of a substrate with at least one partially coatable surface, and c) the application of at least one metallic protective layer containing a first metal, a first precious metal or a first metal alloy and at least one compound, an acid and/or a salt of a second metal, a second precious metal and/or a second metal alloy, in particular at least one acid, one oxide, double oxide, oxide hydrate, sulphide, halogenide, nitride, carbide, carbon nitride, boride, silicide, oxyhalogenide and/or salt of a second metal, a second precious metal and/or a second metal alloy.

In the metal protective layer, at least one of the compounds, acids and/or salts of the second metal, of the second precious metal or of the second metal alloy are distributed or embedded in the first metal, the first precious metal or the first metal alloy. It is particularly preferred that the compound, the acid and/or the salt of the second metal, precious metal or metal alloy is essentially distributed evenly in the first metal, precious metal or metal alloy in the metallic protective layer. In a further preferred embodiment, at least one of the named compounds, acids and/or salts of the second metal, precious metal or metal alloy is distributed essentially, in particularly evenly, over the entire thickness of the protective layer in the first metal, precious metal or metal alloy in the metallic protective layer. This is intended to include the fact that the concentration of the compound, acid and/or of the salt of the second metal, precious metal or metal alloy facing one or both of the opposite boundary surfaces of the metal protective layer can decrease to a greater or lesser extent either continuously, in stages or in another manner, e.g., in jumps, as is shown below in FIGS. 2 and 3, for example. The metallic protective layer can accordingly also be regarded as being an internal mixture or as a metallic composite layer containing a first metal, a first precious metal or a first metal alloy, wherein at least one compound, one acid and/or one salt of a second metal, of a second precious metal and/or of a second metal alloy, in particular at least one acid, one oxide, one double oxide, oxide hydrate, sulphide, halogenide, nitride, carbide, carbon nitride, boride, silicide, oxyhalogenide and/or salt of a second metal, of a second precious metal and/or of a second metal alloy is present or embedded.

With the method according to the invention, a substrate is obtained with a metallic protective layer, which as such is itself highly corrosion protected, and in addition by means of the application of a substrate, said substrate also protects against corrosion insofar as it is a metallic substrate. While with non-metallic substrates the property of the corrosion protection thus relates to the metallic protective layer, with metallic substrates, not only a metallic protection layer is obtained which is itself corrosion protected, but to a far greater extent, this protective layer equips the metallic substrate with highly effective corrosion protection. At the same time, this metallic protective layer is generally very shiny, so that very shiny, highly resistant substrate surfaces are made possible.

According to a further embodiment of the method according to the invention it is provided that stage c) of the method comprises the following sub-stages:

c) i) The application of a metal layer consisting of a first metal, a first precious metal or a first metal alloy onto the substrate, and c) ii) The treatment of the metal layer with a fluid, in particular an aqueous system, containing at least one compound, one acid and/or one salt of a second metal, a second precious metal and/or a second metal alloy, in particular one acid, one oxide, double oxide, oxide hydrate, sulphide, halogenide, nitride, carbide, carbon nitride, boride, silicide, oxyhalogenide and/or salt of a second metal, of a second precious metal and/or of a second metal alloy, forming a metallic protective or composite layer.

Here, as an acid, oxide, double oxide, oxide hydrate, sulphide, halogenide, nitride, carbide, carbon nitride, boride, silicide, oxyhalogenide or salt of a second metal, or a second precious metal or of a second metal alloy, one acid, one oxide, double oxide, oxide hydrate, sulphide, halogenide, nitride, carbide, carbon nitride, boride, silicide, oxyhalogenide or one salt of one element of the fourth or fifth group of the Periodic Table of elements, preferably of zirconium, hafnium and/or titanium, is used.

Here, it is particularly preferred that use is made of the elements in the fourth group in the Periodic Table, in particular zirconium, titanium and hafnium, with a particular preference for zirconium. Naturally, any mixtures of compounds of a second metal, precious metal or of a second metal alloy such as one or more oxides, double oxides, oxide hydrates and/or oxyhalogenides, in particular oxyfluoride, can also be present adjacent to each other in the metal layer, forming the metallic protective layer. Furthermore, any mixtures of compounds of several second metals, precious metals or metal alloys, e.g., zirconium dioxide and titanium dioxide, can be present adjacent to each other in the metallic protective layer. The compounds, acids and/or salts of the $4^{th}$ and $5^{th}$ group can also be present in any mixture in the metal layer, forming the metallic protective layer. Suitable compounds, acids and salts of the metals in the $5^{th}$ group of the Periodic Table of elements are based on vanadium, niobium and tantalum. It can be seen that the method according to the invention is technically far removed from the standard galvanic chrome-plating process, and yet in terms of the shiny effect, shine resilience and corrosion resistance, at least equal results are achieved.

Suitable substrates can be both of a metallic and of a non-metallic nature. For example, substrates containing or made of wood, chipboard, glass, carbon materials, ceramic or plastic can be considered as suitable non-metallic substrates. Particularly suitable plastics are PVC, polyolefine, in particular polypropylene, polyamide and polyoxyalkylene, e.g., POM. In suitable substrates, non-metallic components or sections can be present alongside metallic components or sections.

In general, moulds made of all metals, metal alloys and precious metals are suitable as metallic substrates. Substrates made of aluminium, iron, steel, stainless steel, copper, brass, magnesium, iridium, gold, silver, palladium, platinum, ruthenium, molybdenum, nickel, bronze, titanium, zinc, lead, tungsten or manganese and their alloys are examples of suitable substrates. Preferred metal substrates or metal substrate surfaces comprise or in particular consist of aluminium or aluminium alloys, magnesium or magnesium alloys or titanium or titanium alloys. Here, highly pure aluminium, magnesium or titanium is preferred, in particular with an aluminium, magnesium or titanium portion of at least 90% by weight, in particular at least 99% by weight in relation to the total weight of the metallic protective layer. For the metallic substrate, aluminium and aluminium alloys are particularly preferred for use.

According to a further embodiment, the method according to the invention furthermore comprises between stages a) and c) the following stage:

b) The application of at least a first base coat layer onto the substrate, in particular, metallic or plastic substrate, and/or grinding and/or polishing the in substrate surface, in particular the metallic substrate surface.

For metallic substrates, a method has been shown to be particularly suitable comprising after stage a) the following stages:

b) The application of at least a first base coat layer onto the substrate and/or grinding and/or polishing the substrate surface c) i) The application of a metal layer comprising at least a first metal, a first precious metal and/or at least a first metal alloy onto the first base coat layer and/or onto the polished and/or ground substrate surface by means of Physical Vapour Deposition (PVD) layering, vaporisation by means of an electron stream vaporiser, vaporisation by means of a resistance vaporiser, induction vaporisation, ARC vaporisation, cathode spraying (sputter coating), and/or by means of immersion or spraying, and c) ii) The treatment of the metal layer with a fluid, in particular an aqueous system containing at least one compound, one acid and/or one salt of a second metal, a second precious metal and/or of a second metal alloy, in particular at least one acid, one oxide, double oxide, oxide hydrate, sulphide, halogenide, nitride, carbide, carbon nitride, boride, silicide, oxyhalogenide and/or salt of a second metal, of a second precious metal and/or of a second metal alloy, forming a metallic protective or composite layer.

Here, it can be provided that at least a second base coat layer is applied to the first base coat layer.

Here, it is frequently advantageous that the first and/or second base coat layer are hardened after application in at least one subsequent heat treatment stage and/or are annealed.

As an alternative to applying a first and if appropriate, a second base coat layer or in addition to the application of a base coat layer, a pre-switched mechanical smoothing of the metal substrate surface can be provided, for example, by means of grinding and/or polishing or vibratory grinding. Ground or polished metal surfaces frequently already have a surface quality of such a nature that when a metallic protective or composite layer is applied according to stage c) of the method according to the invention, a highly corrosion protected substrate is obtained.

The first and/or second base coat layer can for example be applied using a wet lacquer method and/or a powder coating method. Suitable examples are powder-type polyester resin compounds and epoxy/polyester powder. Suitable epoxy resins as base coat layer materials are known commercially under the brand name "Valophene", for example. Base coat layers based on a urethane resin, as described in U.S. Pat. No. 4,431,711, are also suitable as first and second base coat layers. As an alternative, polyester or polyacrylic materials, as mentioned in WO 2004/014646 A1, can also be used. The wet lacquer method is most particularly preferred for the purpose of applying a base coat. Particularly preferred are those base coat application methods in which the hardening of the base coat layer is achieved using UV radiation, rather than hardening. With the hardening using UV radiation, no regular additional warming is required, even when in general, no heat is generated during the process. Suitable powder lacquer, wet lacquer and UV-hardened layering systems and their application will be sufficiently familiar to persons skilled in the art. Depending on the quality of the surface (e.g., porous or raw), one or more base coat layers can be applied in order to smooth the surface. In particular with the first base coat layer, as can here be used on metal substrate surfaces in particular, an advantageous smoothing in of the surface is achieved in general. The base coat layer thus regularly represents a "smoothing layer". With a base coat layer, all angle areas are in general reached, so that even in these areas, surface roughness can be smoothed.

According to the invention, it can furthermore be provided that a standard conversion layer, e.g., such as the one described in U.S. Pat. No. 2,825,697 or U.S. Pat. No. 2,928,763, can be applied to the substrate. As an alternative or addition to this, according to a further embodiment, the layerable surface of the substrate can be treated with an aqueous system containing at least one acid, one oxide, one double oxide, one oxide hydrate, one sulphite, one halogenide, nitride, carbide, carbon nitride, boride, silicide, one oxyhalogenide and/or one salt of a second precious metal and/or a second metal alloy as described above (stage a).

If the substrate is a metal substrate, it has regularly been shown to be advantageous, in particular when this metal substrate has been directly removed from the respective production process, to clean the surface of the substrate in a suitable manner. For example, in a first, preparatory stage, the metal substrate surface is de-greased using alkaline or acid reagents. De-greasing agents of this type are offered, for example, by Henkel KGaA under the commercial name of Riduline®. In order to ensure that no de-greasing reagents remain on the surface which may negatively affect the subsequent processing stages, a rinsing stage with water is then regularly conducted. Commercial de-greasing stages are also known under the name of decoction or etching greases. As an alternative, a metal surface can be anodically de-greased in an electrolyte de-greasing bath.

Moreover, in some cases it has been shown to be advantageous to subject the surface of the metal substrate, in particular the de-greased metal substrate surface to at least one pickling stage. For the pickling of the metal substrate surface, e.g., an acid rinse bath is used. A suitable pickling solution is accordingly, e.g., dilute salt acids (1:10 vol/vol). As a result, an essentially oxide-free metal surface is usually obtained.

In the same way as the de-greasing stage, the pickling stage is generally completed by a rinsing stage. Here, it has been shown to be very effective, at least towards the end of the rinsing procedure, and preferably during the rinsing procedure, to use de-ionised water.

In a preferred embodiment, the metallic protective or composite layer is applied to a de-greased and/or pickled metal substrate surface in accordance with stage c), or the metal layer in accordance with stage c) i) of the method according to the invention. According to a further embodiment, the first and if appropriate, the second base coat can also be applied to a de-greased and/or pickled metal substrate surface.

If the metal substrate surface is polished and/or ground or vibratory ground, the de-greasing and/or pickling stage can frequently be omitted. Usually, with this type of surface treatment, sufficient material is removed from this surface, whereby impurities or other residues are also removed which are lying or adhering to the surface. If the surface is polished or ground, it is moreover frequently possible to omit the application of a first and if appropriate, a second base coat layer. With the polishing or grinding, an even or smooth surface is usually obtained of such a quality that no smoothing in by applying a base coat layer is then required. However, when the metal substrate comprises numerous angles and corners which cannot easily be adequately polished or ground, it can be advisable to subsequently conduct a first and if appropriate, also a second base coat layer.

Glass and ceramic substrates are usually per se so smooth that no polishing stage or application of additional base coat layers is required. This generally also applies to plastic substrates. If plastic substrates with a particularly smooth surface, in particular with a high degree of reliability, are required, at least one base coat layer is usually applied. Suitable base coat layers for plastic substrates are, for example, clear lacquers or UV lacquers. Wood substrates, and in some cases also ground and/or polished wood substrates, frequently require at least one base coat layer, however, before the metallic protective layer or metallic layer can be applied.

According to a further optional embodiment of the invention, it is provided that before stage c) at least one adhesive agent is applied to the surface of the substrate, the first base coat layer and/or the second base coat layer for the metallic protective layer or metallic layer, or is generated on said surface. A suitable adhesive agent can be generated or applied using, e.g., at least one plasma pre-treatment, preferably by means of at least one oxygen plasma and/or at least one polymer plasma, in particular comprising hexamethyl disiloxane. It can also be provided that at least one inorganic or metal organic adhesive agent is applied as an adhesive agent. Here, a tin(II) salt in an acidic solution or at least one silane containing amines in an alkaline solution is preferably used.

Plastic moulded parts which can be treated with the method according to the invention can be made of, e.g., ABS, SAN, ASA, PPE, ABS/PPE, ASA/PPE, SAN/PPE, PS, PVC, PC, ABS/PC, PP, PE, EPDM, polyacrylates, polyamides, POM or teflon. If the application of a base coat layer is required, these base coat materials are preferably applied using the wet lacquer method. With highly heat-resistant plastics, the powder lacquer method is also suitable.

Before the metallic protective or composite layer is applied according to stage c), or the metal layer is applied according to stage c) i), the substrate surface is preferably dried in order to be free of water residues.

Advantageously, following method stage c) or method stage c) i), the surfaces obtained are rinsed with water. Preferably at least towards the end of this rinsing stage, and preferably during the entire rinsing stage, fully desalinated water (also known as de-ionised water) is used.

The thickness of the metallic protective or composite layer to be applied to the substrate according to method stage c) of the method according to the invention, or the metal layer to be applied according to stage c) i) is preferably in the region of between 20 nm and approximately 10 μm, particularly preferred in the region of between 30 nm and 5 μm, and in particular in the region of between 50 nm and 1 μm. Very satisfactory results are for example obtained with layer thicknesses in the range between 50 nm and 120 nm. The results according to the invention can regularly already be obtained with layer thicknesses of less than 100 nm.

According to the invention, the first metal for the metallic protective or composite layer according to stage c) or the metal layer according to stage c) i) comprises, in particular, aluminium, gold, brass, bronze, silver, palladium, platinum, chrome, magnesium, titanium, zinc, stainless steel or alloys of these metals. A particularly suitable protective/composite or metal layer comprises aluminium or an aluminium alloy.

In particular, it is preferred that the purity of the first metal, preferably of the aluminium, amounts to at least 80% by weight, preferably over 90% by weight, and best of all at least 99% by weight.

For the application of the metallic protective layer according to stage c) or the metal layer according to stage c) i), the method of Physical Vapour Deposition (PVD) coating, vaporisation using an electron stream vaporiser, vaporisation using a resistance vaporiser, induction vaporisation, ARC vaporisation and cathode spraying (sputter coating) can be used, in each case preferably in a high vacuum. Furthermore, the application of the metallic protective layer according to stage c) or the metal layer according to c) i) can be conducted by immersion in a first metal, a first precious metal or a first metal alloy which is present in fluid form, or by spraying with a first metal, first precious metal or first metal alloy which is present in a fluid form. These methods are known to persons skilled in the art. The metallic protective or composite layer or the metal layer can, for example, be applied to the substrate or to its coatable surface, to the first base coast layer, the second base coat layer and/or the adhesive agent. Preferably, a Physical Vapour Deposition (PVD) coating method is used. Here, metal coil or metal shuttle vaporisers which are resistance heated are used, wherein tungsten coils in a wide range of different forms are preferred. With the PVD method, in general, a vaporiser is equipped with coils which can be clamped onto vaporiser rails which are insulated from each other. In each coil, a precisely determined quantity of a first metal, precious metal or first metal alloy is preferably given. After the PVD system has been closed and evacuated, the vaporisation can be started by switching on the power supply, as a result of which the vaporiser rails make the coils glow. The solid metal begins to melt and completely moistens the coils, which are usually drilled. Following a further supply of power, the fluid metal is transferred to the gas phase, so that it can be deposited on the substrate to be coated.

The vaporisation from metal shuttles proceeds in a similar manner. The vaporiser equipment is here in principle identical, but shuttles are usually used which are made of high melting metal sheets, such as tungsten, tantalum or molybdenum shuttles.

A further preferred method for depositing the metal layer on the substrate is cathode spraying (sputter method). Here, a cathode is arranged in an evacuated container which is connected with the negative pole of a power supply. The coating material which is sprayed is mounted immediately in front of the cathode, and the substrates to be coated are arranged opposite the coating material to be sprayed. Furthermore, argon can be fed through the container as a process gas which ultimately also comprises an anode which is connected with the positive pole of a power supply. After the container has been pre-evacuated, cathode and anode are connected with the power supply. Due to the systematic and controlled influx of argon, the central free path length of the charge carrier is significantly reduced. In the electric field between cathode and anode, argon atoms are ionised. The positively charged particles are accelerated with high energy to the negatively charged cathode. When they strike, and when the particles are hit in the coating material, said material is transferred to the vaporisation phase, is accelerated with high energy into the free space and then evaporates onto the coated substrates.

Further vaporisation methods which can be used in the method according to the invention are conducted using an electrode ray vaporisation, resistance vaporisation, induction vaporisation and/or a vaporisation using a thermal, non-stationary curve (ARC vaporisation).

Methods for applying a metal layer to a metallic or non-metallic substrate are incidentally also known to persons skilled in the art, and should also be included here, even if they are not named specifically.

With the method according to the invention, it can also be provided that after stage c) or c) ii), at least one heat treatment stage is initially completed.

Prior to treatment of the metal layer according to stage c) i) with an aqueous system containing at least one acid, one oxide, double oxide, oxide hydrate, sulphide, halogenide, nitride, carbide, carbon nitride, boride, silicide, oxyhalogenide and/or salt of a second metal, a second precious metal and/or a second metal alloy, preferably of zirconium, hafnium or titanium, it is preferred that the metal layer is moistened or rinsed with water, preferably de-ionised water. Preferably, the water used here has a conductance value of less than 100 mS per cm, preferably less than 50 mS per cm and particularly preferred, less than 35 mS per cm.

The aqueous system can, for example, take the form of a solution, a suspension or an emulsion. Preferably, the aqueous system is used as a solution, i.e., the compounds, salts and/or acids named above are present in it in an essentially dissolved state, at least prior to application.

In the substrates according to the invention, in a further embodiment, the compound, acid and/or salt of the second metal, the second precious metal and/or the second metal alloy, in particular the acid, oxide, double oxide, oxide hydrate, sulphide, halogenide, nitride, carbide, carbon nitride, boride, silicide, oxyhalogenide and/or salt of the second metal, second precious metal and/or the second metal alloy, preferably based on an element in the $4^{th}$ group of the Period Table of Elements, in particular, zirconium, is present in quantities of between 0.2% and 10% by weight, preferably in the region of between 1% and 7% by weight and particularly preferred in the region of between 1.5% and 5% by weight in relation to the overall weight of the metallic protective or composite layer.

In a particularly preferred option, at least one oxide, double oxide, oxide hydrate and/or oxyhalogenide is present in the metallic protective or composite layer, in particular based on an element from the fourth group in the Periodic Table, in particular zirconium fluoride, zirconium oxyfluoride and/or zirconium dioxide. Zirconium dioxide is particularly preferred. As double oxides, e.g., aluminium/zirconium can be used. Furthermore, according to a further embodiment, it is preferred that in the composite layer, a second metal, second precious metal or a second metal alloy, in particular based on zirconium, titanium and/or hafnium, is present in an oxidic compound.

Without being bound to any specific theory, it is presently assumed that the compounds of the second metal, precious metal or metal alloy which are present in the aqueous system, e.g., as acids or salt are present in the metallic protective layer, having been transferred to an oxide, double oxide, oxide hydrate or oxyhalogenide.

Suitable acids which are based on an element in the $4^{th}$ group comprise, e.g., hydrofluorozirconic acids ($H_2ZrF_6$), fluorotitanium acids ($H_2TiF_6$) and fluorohafnium acids ($H_2HfF_6$). Naturally, mixtures of different acids can also be used. These fluoric acids can be used both in their pure state and containing impurities such as fluoric acid. In the aqueous systems, the acids can be present, e.g., in quantities of up to 5% by weight, in particular of up to 3.5% by weight in relation to the overall weight of the aqueous system.

Fluoric acids can also be present in the aqueous systems, e.g., in quantities in a range of between 0.1% and 3% by weight.

Among the suitable salts, it is preferred that ammonium zirconium carbonate, which is available, for example, from Magnesium Electron Inc. under the brand name of Bacote 20, be used ($(NH_4)_2[Zr(OH)_2(CO_3)_2].n\ H_2O$). Furthermore, alkali metal and ammonium fluorozirconates such as $Na_2ZrF_6$, $KZrF_6$, $(NH_4)ZrF_6$, as well as zirconium nitrates, zirconium oxynitrates, zirconium carbonates, zirconium fluorides or zirconium sulphates can also be used. The compounds based on the $4^{th}$ group can be used as such or in any mixture with each other.

Naturally, it is also possible to add further ingredients to the aqueous systems, alongside the aforementioned compounds or their mixtures. For this purpose, nitric acids, fluoric acids, phosphoric acids, salts of the named acids, ammonium bifluoride and ammonium sulphate are possible. A suitable titanium salt is provided, e.g., by ammonium titanium fluoride.

Preferably, the aqueous system contains fluoride ions in a free and/or complex form. Fluoroborate salts and acids are suitable complexed fluoride ions, as are alkali metal and ammonium bifluorides. In very general terms, complex fluorides of titanium, zirconium, hafnium, silicon and/or boron are particularly suitable. Preferably, complex fluorides of zirconium are used.

Suitable aqueous systems can preferably contain alongside the acids, one oxide, double oxide, oxide hydrate, sulphide, halogenide, nitride, carbide, carbon nitride, boride, silicide, oxyhalogenide and/or salt of a second metal, a second precious metal and/or a second metal alloy, preferably based on one element of the $4^{th}$ group of the Periodic Table of elements (IUPAC; formerly assigned the name Group IVB or IV-B), in particular zirconium, titanium and/or hafnium, at least one polymer compound which can be present in a dissolved state in the aqueous mixture, in emulsion form or in the form of undissolved, dispersed particles.

Among the polymer compounds, the polyacrylic acids and their salts and esters should be mentioned in particular. These acids, esters and salts can be present in the aqueous solution in a dissolved or dispersed form. The quantity of polymer components can be varied to a wide degree, and is preferably in the range of between 0.1 and 0.5 g per liter.

Polymethyl vinyl maleic acid and polymethyl vinyl maleic acid anhydride are also possible polymer materials. Suitable polyacrylic acids ideally have a molecular weight of up to 500,000. Preferably, frequent use is also made of mixtures of possible polymer compounds. For example, mixtures containing polyacrylic acids, their salts or esters with polyvinyl alcohol should be mentioned in particular. Suitable polymers furthermore comprise hydroxy ethyl ether of cellulose, ethylene maleic acid anhydride, polyvinyl pyrrolidine and polyvinyl methyl ether.

Particularly preferred polymer components according to the basic principle of the present invention comprise a crosslinked polyester containing a large number of carbon acid functions and a large number of hydroxyl groups which may have reacted with each other either partially or fully. These crosslinked polyester polymers can for example be the reaction product of a first polymer containing carbon acid functions with a second polymer containing hydroxyl groups. For example, polyacrylic acids and polymethyl vinyl maleic acid anhydride can be used as first polymers of this type, while polyvinyl alcohol is a suitable second polymer. Interestingly, both the reaction product of the aforementioned first and second polymers and their mixture is a suitable component of the aqueous system for the treatment according to the method in accordance with the invention. Moreover, an aqueous solution of this type can additionally preferably contain fluoric acids. Ammonium salts, for example, are possible suitable salts of the aforementioned polyacrylic acids.

In addition, as a suitable polymer, 3-(N—$C_{1-4}$-Alkyl-N-2-hydroxethylaminomethyl)-4-hydroxystyrol is also a suitable polymer, in particular when it is used as a compound of the $4^{th}$ group of hexafluorozirconium acids. Furthermore, if necessary, the homopolymer of the 4-hydroxy styrol can also be present, with an average molecular weight in the region of between 3000 and 6000. Related details are given in U.S. Pat. No. 5,089,064.

In a further preferred embodiment, at least one acid, one oxide, double oxide, oxide hydrate, sulphide, halogenide, nitride, carbide, carbon nitride, boride, silicide, oxyhalogenide and/or salt of the first metal, the first precious metal and/or the first metal alloy are also present in the metallic protective layer, alongside one acid, one oxide, double oxide, oxide hydrate, sulphide, halogenide, nitride, carbide, carbon nitride, boride, silicite, oxyhalogenide and/or salt of the second metal, second precious metal and/or second metal alloy. In a particularly preferred manner, at least one oxide, double oxide, oxide hydrate and/or one oxyhalogenide of the first metal, first precious metal and/or the first metal alloy are present in the metallic protective layer, alongside one oxide, double oxide, oxide hydrate and/or oxyhalogenide of the second metal, second precious metal and/or second metal alloy.

The aqueous systems can also contain fatty acids, fatty alcohols and/or in particular fatty amines or any mixtures thereof. The fatty amines can also be present in the form of their ammonium salts. Fatty amines according to the basic principle of the present invention thus also comprise the corresponding ammonium salts. Here, compounds with saturated fatty alkyl chains are preferably used. The length of the linear fatty alkyl chains is preferably in a range of between $C_8$ and $C_{24}$. Preferred fatty amines or the corresponding ammonium compounds are based on an alkyl residue of $C_{12}$, $C_{14}$, $C_{16}$ or $C_{18}$. Suitable fatty acids comprise, e.g., capric acid.

Furthermore, polyoxy alkylene glycol ether, in particular polyoxy ethylene glycolethers, polypropylene glycolethers and their mixtures can be added to suitable aqueous systems. Here, all standard commercially available glycol ethers can be used.

Suitable ph values for the aqueous systems lie or are maintained preferably in the range of between 1.5 and 6.5, preferably in a range of between 1.5 and 5.0, and in particular between 2.0 and 4.5. If the ph value of the aqueous systems is required to be increased, additions of ammoniac or ammonium hydroxide are above all suitable for this purpose, e.g., in the form of a 3% ammoniac solution. In addition, conventional bases known to persons skilled in the art can be used.

The conductance of the aqueous system used is preferably in the range of between 100 and 2000, particularly preferred in the range of between 150 and 1500, and in particular in the range of between 200 and 1000 μS per cm.

The optional components of the aqueous system described above are also present in a preferred embodiment, either individually or in any combination, in the metal layer, and are then also a part of the metallic protective or composite layer.

According to an advantageous embodiment of the present invention, it is provided that after the metal layer has been applied according to stage c) i), and prior to the treatment stage c) ii) and/or after stage c), in each case in particular directly, the substrate thus coated is subjected to a rinsing stage, with in particular fully de-salinated water. Following this process, preferably at least one drying stage in each case is completed in order to dry the surface. The drying stage can be conducted, e.g., at temperatures in the range of between 120° and 180° C., for example, at approximately 140° C. The water used for rinsing preferably has a conductance of less than 60 mS per cm, preferably less than 50 mS per cm and in particular, less than 35 mS per cm. In particular, the last rinsing process respectively before the subsequent method stage or before a drying stage has the aforementioned conductance.

The ph value and/or the conductance of the aqueous system are preferably maintained at an essentially constant level for the duration of the treatment of the metal layer, in particular within the aforementioned regions.

The substrate which is coated with the metal layer can be treated, e.g., using immersion, rinsing or spraying with the aforementioned aqueous system, containing at least one of the named compounds of the second metal, the second precious metal or the second metal alloy. The metal layer is preferably treated with this aqueous system under increased pressure, for example, in the form of high-pressure water jets. Here, it has been shown to be advantageous to direct a plurality of fine individual water jets at the substrate. Suitable pressures for the treatment with the aqueous system lie, e.g., above 0.2 bar, preferably in the region of between 0.5 and 50 bar, and particularly preferred in the region of between 0.2 and 15 bar, in particular 0.9 and 1.5 bar. These pressures are measured on the surface of the metal layer. With the variants described above, at least one acid, one oxide, double oxide, oxide hydrate, sulphide, halogenide, nitride, carbide, carbon nitride, boride, silicide, oxyhalogenide and/or salt of a second metal, a second precious metal and/or a second metal alloy, in particular of an element of the $4^{th}$ group of the Periodic Table, preferably zirconium, titanium or hafnium, is incorporated into the metal layer.

Suitably, the temperature of the aqueous system during the treatment of the substrate lies in the region of between 15° and 50° C., preferably in the region of between 20° and 40° C. Usually, a treatment period of between 20 and 120 seconds is sufficient in order to obtain the substrate according to the invention.

Preferably, the substrate equipped with a metal layer, in particular with an aluminium layer according to stage c) i), is treated directly after the application of said layer to the substrate surface with the aqueous system described, as mentioned above. This procedure is conducted in a production chain, for example, in which the substrate is subjected to all production stages in succession.

In a preferred embodiment, the share of iron ions in the aqueous system does not exceed 10 ppm.

With the invention, it is also suggested that after stage c) or c) ii), at least one protective lacquer layer or glaze can be applied. The protective lacquer can be, e.g., clear lacquer or a transparent powder, and is preferably applied using a wet lacquer method or powder coating method. Furthermore, the invention provides that the protective lacquer can contain at least one dye or one pigment.

Furthermore, in order to dye the substrate, use can be made, in particular, of suitable glazes which are known to persons skilled in the art. These can be used to create in a simple manner, e.g., bronze, titanium and gold tones, as well as individual colour tones such as red, blue, yellow, green, etc., and all epoxy colours.

The present invention further relates to coated substrates which are obtainable according to the method in accordance with the invention. The object of the invention is consequently also attained according to a further aspect by means of a substrate which is at least partially corrosion protected and in particular shiny, comprising a metallic and/or non-metallic substrate and at least one metallic protective or composite layer, comprising a first metal, a first precious metal or a first metal alloy in the form of a metal layer and therein, in particular distributed essentially evenly, present or placed or embedded at least one compound, one acid and/or one salt of a second metal, a second precious metal and/or a second metal alloy, in particular at least one acid, one oxide, one double oxide, oxide hydrate, sulphide, halogenide, nitride, carbide, carbon nitride, boride, silicide, oxyhalogenide, in particular oxyfluoride and/or salt of a second metal, a second precious metal and/or a second metal alloy.

The substrates according to the invention can be used, for example, as mirrors, mirrored material or as accessory parts for the automobile construction sector. Preferably, they are used as light metal wheel rims or light metal wheels of the automobile construction sector. Naturally, car body components, whether they are made of plastic or metal, can be provided with a metallic protective or composite layer according to the invention. The substrates according to the invention are naturally not restricted to the uses named above.

Accordingly, the present invention comprises coated metallic and non-metallic substrates, comprising, in this order, one substrate, for example made of plastic, aluminium or an aluminium alloy, and a metallic protective or composite layer as described above, in particular based on aluminium. If necessary, in this embodiment, the substrate surface to be equipped with the metallic protective or composite layer can be provided in a ground and/or polished form. In a further, preferred embodiment, the coated structure according to the invention comprises in this order one substrate, preferably with a ground and/or polished substrate surface, one, if necessary chrome-free, conversion layer and a metallic protective or composite layer as described above. According to a further advantageous embodiment, a coated substrate according to the invention comprises in this order one substrate, if necessary with a polished and/or ground surface, a first and if necessary a second base coat layer and a metallic protective or composite layer, as described above. Furthermore, an alternative coated substrate according to the invention comprises in this order one substrate, if necessary with a polished and/or ground substrate surface, one, preferably chrome-free, conversion layer, a first base coat layer and if necessary a second base coat layer, and a metallic protective or composite layer as described above. All of the embodiments described above can additionally be covered with a preferably transparent finishing lacquer layer and/or a glaze layer.

The invention is based on the surprising finding that as a result of the method according to the invention, a substrate with a metallic protective layer is provided which comprises excellent corrosion resistance as well as a highly attractive chrome appearance. A chrome appearance is one which is generally only achieved with the galvanic chrome-plating of substrates. A visual appearance of this nature is not achievable with the methods known in the prior art. With the method according to the present invention, a corrosion resistant, very shiny substrate with a strongly adhesive coat can be obtained even with complex geometry, such as a light metal wheel rim or a vehicle emblem made of plastic, such as the Mercedes star, which in terms of visual appearance is identical to galvanically chrome-plated substrates, while additionally fulfilling all test standards specified by the automobile industry.

The substrates according to the invention show surprising levels of corrosion resistance, even when the surfaces have been subjected to mechanical damage, such as from stone impact or scoring. It was in particular not to be anticipated that metal substrates, in particular aluminium substrates, would remain intact and show the shiny parts as is generally only possible with particularly high quality chrome components. The advantageous effects in terms of corrosion resistance and shine naturally also occur when no base coat layer is applied to the substrate, and no concluding finishing lacquer layer is used.

In contrast to standard methods, the method according to the invention stands out due to the use of environmentally compatible composite elements, and can be used for the manufacture of a wide range of shiny components. Wheel rims are one example, such as automobile, motorbike and bicycle wheel rims, as well as decorative objects of all types, e.g., decorative strips, car body exterior and interior components such as rear mirror coverings, front covering panels, engine hood covers and consoles, sanitary facility objects such as taps, and reflector surfaces such as with headlights, in particular car headlights. Furthermore, all types of handles, such as door handles, and all types of frame, such as window frames, as well as packaging objects and cases such as for the cosmetic article sector, e.g., lipstick cases, can be produced using the method according to the invention. In addition, a wide range of engine and bicycle components for example, or other means of transport, and assembly components as used in the furniture sector, as well as pipes, hand towel rails, radiators, elevator components, interior and exterior components for aeroplanes, all types of reflector, jewellery, mobile phone cases or components used in building construction can be coated using the method according to the invention. The substrates which are coated according to the invention are also particularly suitable for use in shipbuilding and can be used both for interior and in particular, exterior components. Here, the quality of the products coated according to the invention is reflected in the fact that a long-term corrosion resistance and therefore also a high-quality chrome-like shine is not diminished even by seawater, e.g., sea spray.

Furthermore, it is of particular advantage that problems caused by different expansion coefficients, such as those which are regularly observed with galvanically chrome-plated substrates, no longer occur. The substrates which are coated according to the method no longer tend to form fissures, nor to flake. In this manner, for example, very shiny plastic substrates become possible, which can be used for a wide range of applications, for example, in automobile construction or white goods.

The substrates which are coated using the method according to the invention meet in all respects the required specified values for the chemical resistance test according to the VDA (the German Association of the Automotive Industry) test sheet 621-412 (test A). Furthermore, these substrates according to the invention also show now change to the surface after 240 hours in the salt spray belt test according to DIN 50021-CASS (copper chloride/acetic acid), even when the metal surface has previously been scored. By contrast, with the multiple layer system disclosed in U.S. Pat. No. 6,896,970 B2, wherein a conversion layer is provided on a layer structure consisting of a polymer layer and a metal layer, with the CASS test, a change in the surface was determined after just 168 hours. With the substrates according to the invention, neither the formation of blisters nor base metal corrosion was observed. In addition, the substrates coated according to the invention achieve in the stone impact test according to PV 1213 regular characteristic values ranging from 0 to 0.5. Furthermore, the condensation water constant climate test according to DIN 50017 shows no change to the surface after 240 hours. Finally, these coated substrates also show no change in the outdoor exposure test (Florida test) over a longer period of outdoor exposure lasting several months. The retention of shine according to DIN 67530 is consistently almost 100%. The grid cut characteristic value is regularly Gt 0.

In particular, the method according to the invention has the advantages that it is not necessary to high gloss polish the substrates to be coated, e.g., light metal wheel rims, which with a complex geometry is only possible, if at all, with a very high level of complexity. The preparation of the substrate is thus significantly less complex. It should furthermore be emphasised that the method according to the invention is environmentally compatible, since solvent emissions are essentially completely avoided. The method according to the invention provides a coated substrate with constant corrosion protection even when the layer system is harmed or damaged right through to the substrate. This significantly increases the working life of the substrate which is coated according to the invention. In particular when the substrates according to the invention are used in the automobile industry, such as for light metal wheel rims or reflectors for headlights, this resistance capacity has a positive effect. Furthermore, substrates of this type have an excellent visual appearance and can thus also be used in product design, such as when using the substrate as a wheel or wheel rim. Overall, the general visual impression of the car is improved, and with it, its visual appeal over standard designs.

Figure 1A:
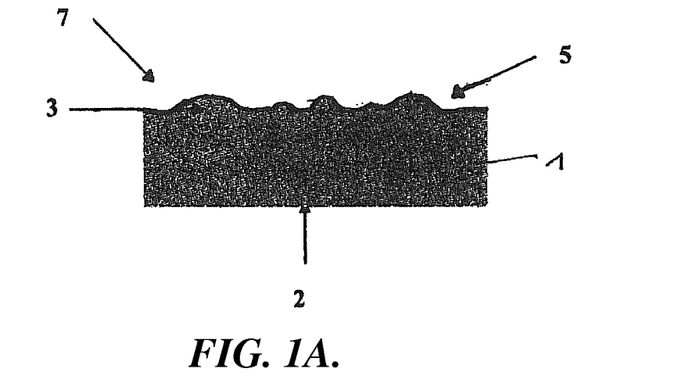
FIG. 1a shows a schematic partial cross section view of a metallic substrate prior to the implementation of the method according to the invention.

The sequence of an embodiment of the method according to the invention will now be explained with reference to the coating of a light metal wheel rim. FIG. 1a shows a schematic partial cross-section view of a first substrate 1 in the form of a cross-section of an aluminium light metal wheel rim 2. The unevennesses 3 of the metal surface are drawn over and shown schematically for purposes of clarity. First, the surface of the substrate 1 can be de-greased in two etching stages. This serves the purpose of removing separating agent residues from the substrate production process which may be present on the surface of the substrate 1. In particular, these two de-greasing stages are conducted in such a manner that the light metal wheel rim 2 is first immersed in a preferably alkaline etching bath. In a second etching stage, the light metal wheel rim 2 is bathed in a 60° C., preferably alkaline, etching bath. The light metal wheel rim 2 is then freed from etching residues by rinsing. Then, the surface of the light metal wheel rim 2 or of the substrate 1 can be subjected to a pickling stage with, e.g., an acid ph agent, in order to remove an oxidation layer which is present. After rinsing with water and then preferably with fully de-salinated water, a first base coat layer 5 can be applied to the substrate 1 (see also FIG. 1b). Preferably, the application of the base coat layer is conducted using a wet lacquer coating method. After the base coat is applied, a heat treatment or tempering stage preferably follows, in order to achieve a hardening or burning in of the base coat layer 5. As can particularly be seen in FIG. 1b, a significantly more even surface 7 is obtained by the base coat layer 5 in comparison with the surface 3 of the substrate.

Figure 1B:
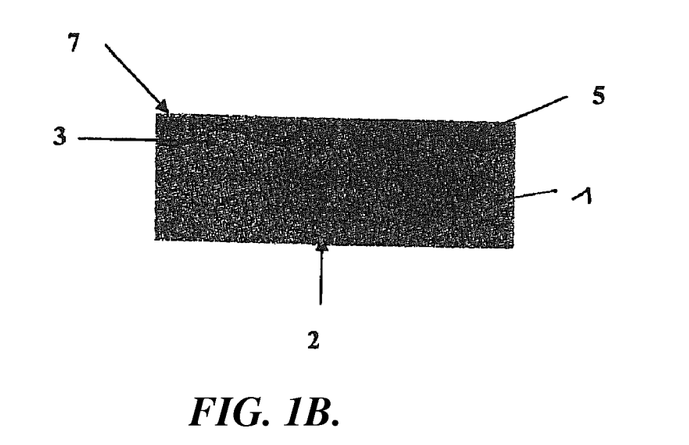
FIG. 1b shows the substrate in FIG. 1a after the application of a base coat layer.

As an option, a further, second base coat layer, which in this exemplary embodiment is not shown, can be applied to the base coat layer 5 for the purpose of further evening out the surface. This is used in particular to generate an optimally smooth surface, an optimum surface hardness and again, to achieve an optimised surface tension. A light metal wheel rim 2 which is prepared in this manner can be added to the stages of the method according to the invention. Naturally, every non-pretreated metallic substrate can also be subjected to the method according to the invention, in particular in a polished and/or ground state.

Figure 1C:
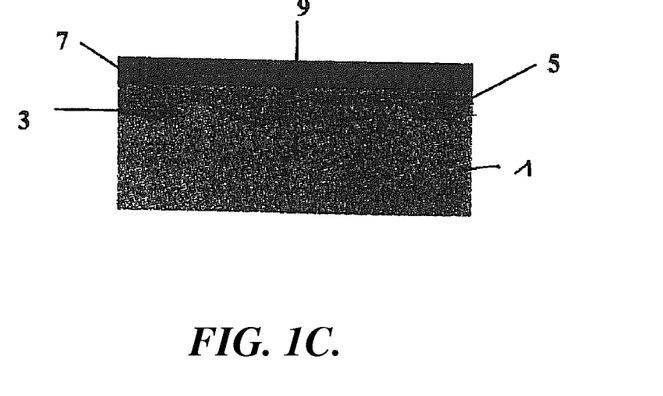
FIG. 1c shows the substrate in FIG. 1b after the application of a metal layer.

For this purpose, as can be seen in FIG. 1c, preferably in a cathode spraying process, a metal layer 9 made of, e.g., aluminium, is applied to the substrate 1 or the base coat layer 5. The average thickness of the metal layer can here be, e.g., approximately between 50 and 120 nm.

In a subsequent stage, as an option, a heat treatment or tempering of the aluminium layer 9 can be conducted, which is preferably implemented at a temperature of approximately 140° C.

As an option, it can be provided that an adhesive agent is created between the base coat layer 5 and the aluminium layer 9 in particular by means of the fact that a plasma pre-treatment takes plates in the vacuum chamber which is used for cathode spraying. As a result of this plasma pre-treatment (smouldering) in an inert gas atmosphere (preferably comprising argon), a "base coat" can be applied. A creation of an adhesive agent of this type (not shown) on the surface of the first base coat 5 also offers economic advantages, since in the later cathode spraying process, the pressure in the vacuum chamber does not generally need to be kept as low, as a result of which the pump-down time of the vacuum chamber can be reduced by approximately 75%, which in turn increases the flow rates. For this purpose, preferably a polymer such as hexamethyl disiloxane is added to the plasma chamber while the plasma is being created.

With the present embodiment, the application of the aluminium layer 9 is followed, in particular directly afterwards, by the treatment with an aqueous system containing zirconic acid ($H_2ZrF_6$) and/or zirconium salts such as zirconium carbonate, for example, ammonium zirconium carbonate, and/or zirconium oxynitrate and if appropriate, zirconium dioxide and/or fluoric acid. The aqueous system here has a ph value of approximately 2.5 and a conductance of less than 100 mS per cm. The ph value can be set using diluted ammoniac solution.

Figure 1D:
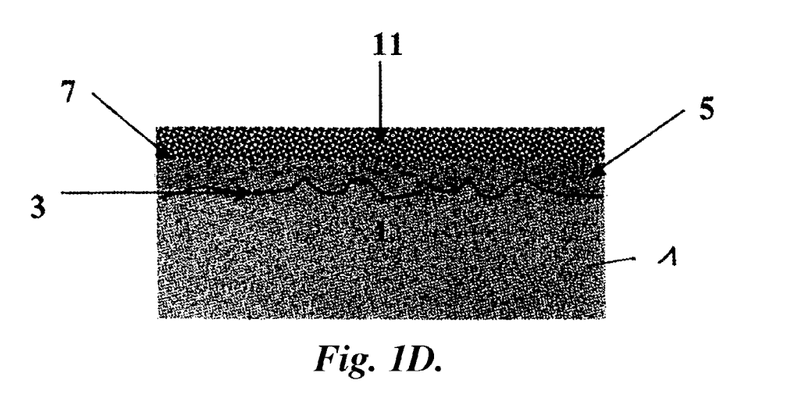
FIG. 1d shows the substrate according to FIG. 1c, containing a metallic or composite layer.

For the production of the aqueous system, fully de-salinated water is preferably used. Advantageously, the substrate which is coated with the aluminium layer is treated with the aqueous system described using suitable nozzles with a plurality of high-pressure jets, preferably with a pressure of greater than 0.5 bar. As a result of, or during, this treatment process, the compounds of the zirconium described above are incorporated into the aluminium layer, essentially over its entire thickness. In this layer, the zirconium is then preferably present bound as an oxide, for example, as zirconium dioxide. Preferably, a rinsing of the surface with fully de-salinated water then follows. The substrate obtained is then preferably subjected to a drying stage. As can be seen in FIG. 1d, as a result of the application of the method according to the invention on the substrate 1, a metallic protective or composite layer 11 is obtained from a first metal, into which, e.g., acids, salts and/or in particular oxides of a second metal or an oxidically bound second metal, preferably of titanium, hafnium and in particular of zirconium are incorporated, which are distributed preferably essentially evenly and over the entire thickness of the metal layer.

In order to prevent damage to the metallic protective layer 11 as a result of mechanical influences, a transparent finishing lacquer layer 13 is preferably subsequently applied to this layer. This can in particular be a powder clear lacquer comprising acrylic, polyester or a mixed powder, or wet lacquers can be applied (see also FIG. 1e).

Figure 1E:
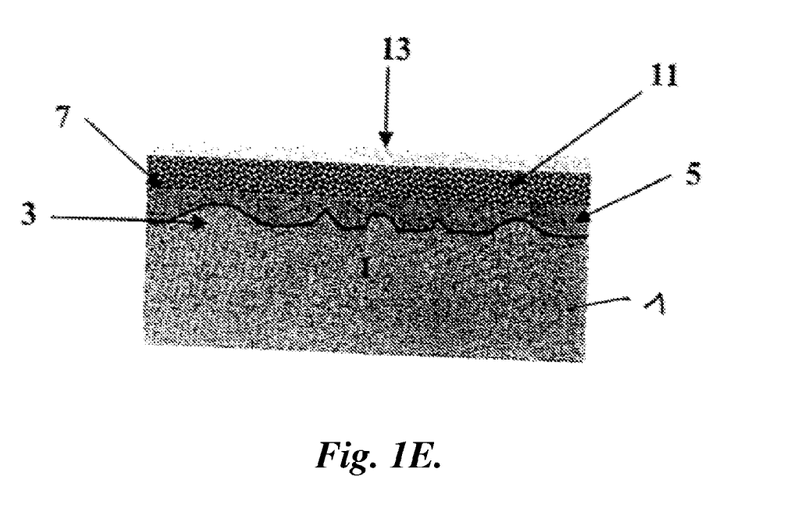
FIG. 1e shows the substrate according to FIG. 1d with transparent finishing layer.
Figure 2:
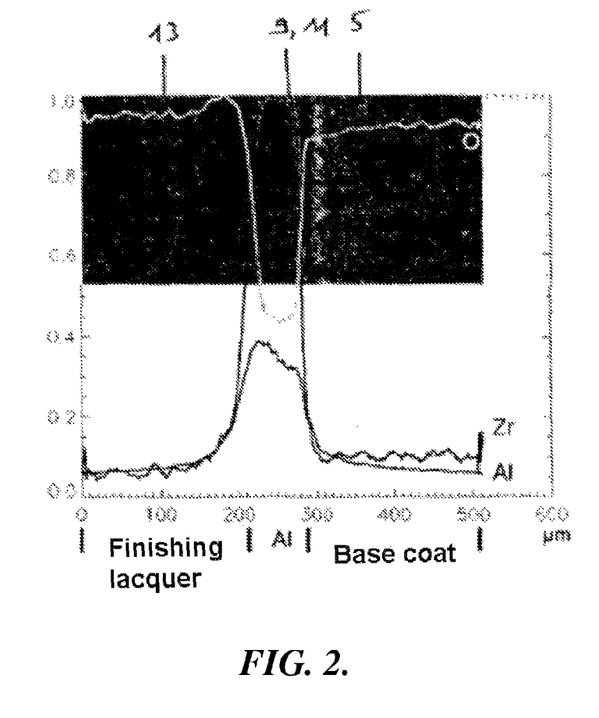
FIG. 2 shows a semi-quantitative view of the lateral distribution of the elements Al, Zr, O in the metallic protective layer by an evaluation of an EDX element map.

FIG. 2 shows a semi-quantitative view of the lateral distribution of the elements Zr, Al and O by an evaluation of an EDX element map (EDX=Energy Dispersive X-ray microanalysis). This result was obtained on the basis of energy dispersive x-ray microanalysis couple with ESEM technology (Environmental Scanning Electron Microscopy; grid electron microscopy) with an excitation voltage of 10 keV. The image was obtained with secondary electrons (SE topography contrast) or with reverse sprayed electrons (BSE material contrast). For the EDX image, from a substrate coated according to the invention (such as that shown in FIG. 1e), containing a base coat layer, the metallic protective or composite layer and the finishing layer, a microtome cross cut was produced at a wide angle (modification factor approx. 400). Between the finishing lacquer layer 13 and the base coat layer 5, the metallic protective or composite layer 11 can be clearly seen. The composite layer also contains as a main component, alongside aluminium, zirconium (in the form of oxidically bound zirconium, as will be shown below) which is essentially evenly distributed over the entire thickness of the aluminium layer 9.

Figure 3:
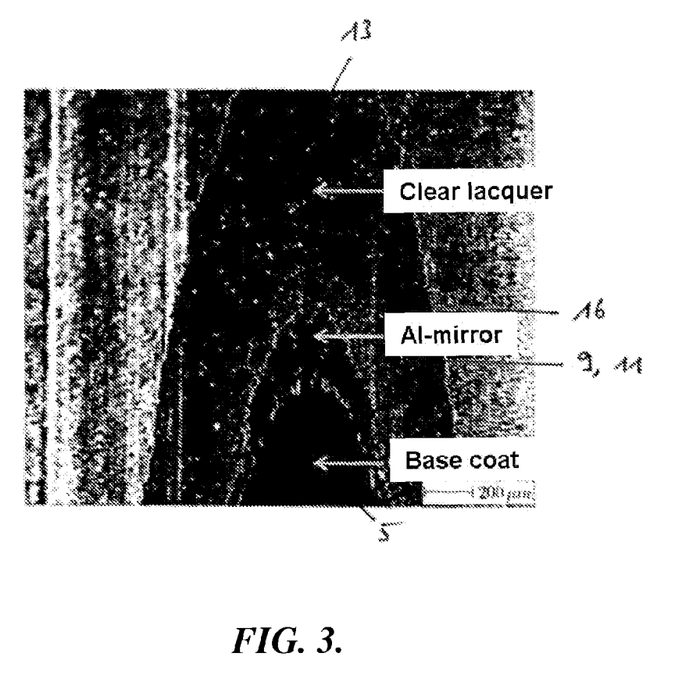
FIG. 3 shows a light microscopic image on a microtome section of the substrate according to the invention.

This result is confirmed on the basis of a line scan analysis over the surface of a microtome main body section, as shown in FIG. 3. The line scan 16 along which the TOF-SIMS measurements were taken at discrete measuring points which followed each other in succession is shown schematically in FIG. 3.

Figure 4:
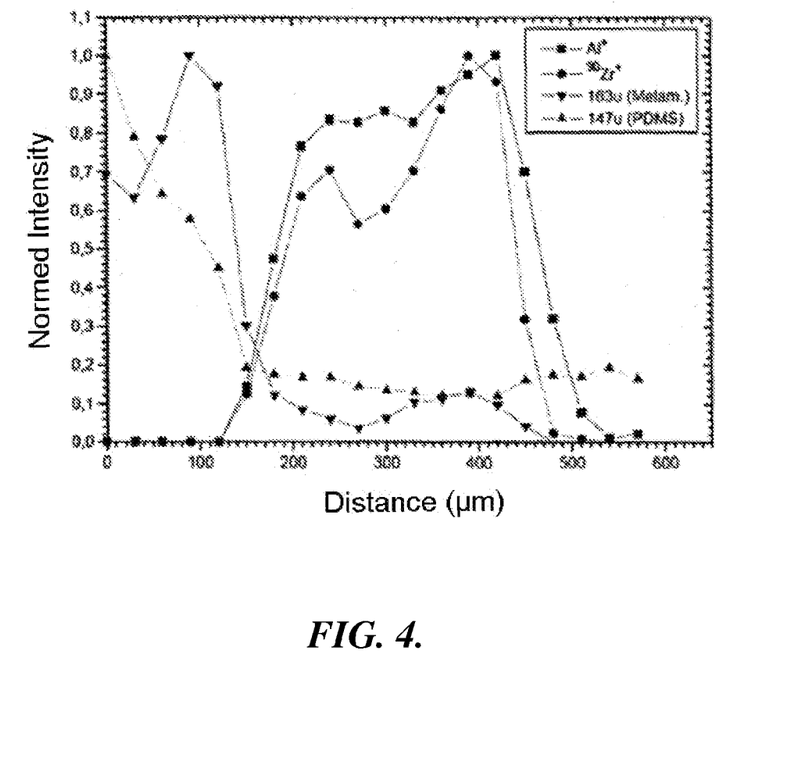
FIG. 4 shows normed intensities of selected elements along a line scan, as sketched in FIG. 3, obtained using TOF-SIMS.

FIG. 4 shows the normed intensities of the signal lines of selected elements or compounds along the line scan 16 according to FIG. 3, which were obtained using TOF-SIMS analyses. The figure was normed to the total intensities of selected hydrocarbon signals. Overall, the intensity of characteristic signals was analysed using mass spectroscopy at 20 measuring points along a line scan length of approximately 600 μm. The line scan extended over the entire width of the metallic composite layer and also covered the protective lacquer layer 13 and base coat layer 5 sections, which are attached to the protective layer. TOF-SIMS is a flying time secondary ion mass spectrometry method for the highly sensitive indication of elements and inorganic and organic compounds on material surfaces. With this method, analyses in the μm and nm range are possible, regardless of location. As can clearly be seen in FIG. 4, for the metallic composite layer 11, zirconium signals are clearly found to a high level of intensity alongside aluminium signals, distributed over the entire thickness of the metallic protective layer. The signals for melamine and PDMS which are also detected in the metallic protective layer can be traced to the protective lacquer layer, and originate from the manufacture of the microtome section used. In order to have an adequate measuring area or length available, it was necessary to cut the analysed sample diagonally. This made it possible to lengthen the measuring length to approximately 400 μm over the metallic composite layer 11 with a thickness of only approximately 100 nm. With this cutting method, it can never be completely prevented on a regular basis that material from other layers in adjacent layers is also incorporated or smeared.

Figure 5:
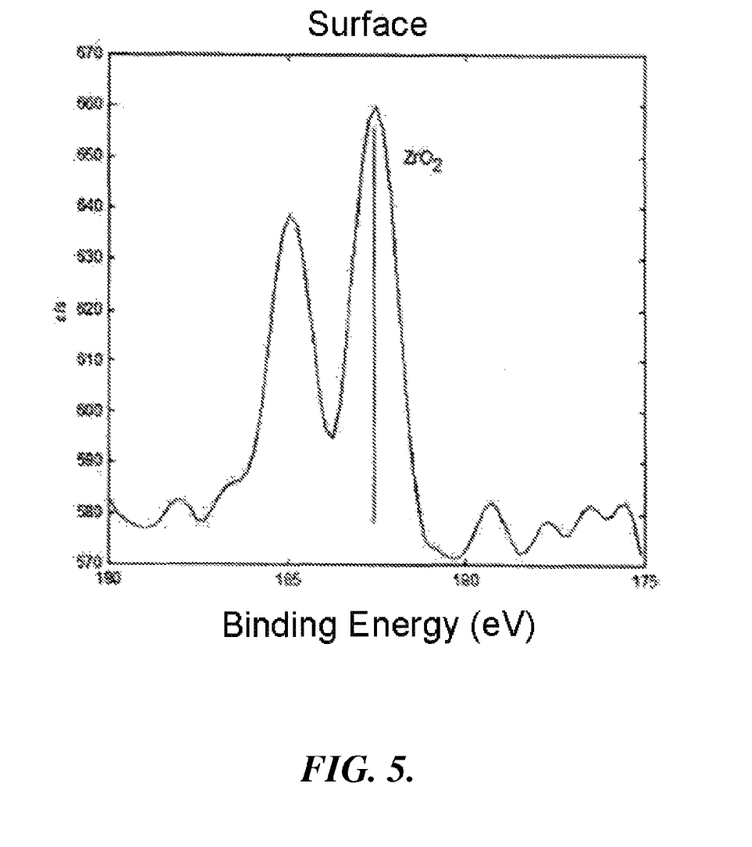
FIG. 5 shows an XPS spectrum in the range of 175 to 190 eV.

FIG. 5 shows an XPS spectrum taken in the area of the metallic composite layer 11 of a substrate 1 according to FIG. 1e), in which the finishing layer has previously been removed. The X-ray Excited Photoelectron Spectroscopy (XPS) enables with solid bodies the determination of bonding stages alongside the quantitative identification of the elements present in the immediate surface proximity. The XPS spectrum recorded for the metallic composite layer shows a characteristic Dublett signal for the zirconium dioxide species, in the range of between 180 and 186 eV. Accordingly, in the metallic protective layer of the substrate analysed here, oxidically bound zirconium is present, predominantly in the form of zirconium oxide. The XPS deep profile analysis of the composite layer 11 also confirmed that zirconium (which is oxidically bound, as has been shown above) is essentially distributed over the entire width of this layer.

The light metal wheel rim obtained using the method according to the invention meets both the standards set by the automobile industry for resilience of the coating, and the legal standards relating to the permission to use the coating system for the treatment of car wheel rims. In particular, a light metal wheel rim treated with the method according to the invention described above has passed the grid cut test according to DIN EN ISO 2409, a salt spray mist test (Cass test) according to DIN EN ISO 50021 (no change to the surface after 240 h) and a stone impact test according to VDA 421412 with any problems arising. Furthermore, the coating of the light metal wheel rim described above has a coat of high quality visual appearance in such a manner that a chrome appearance is achieved with a comparatively low level of complexity and a very highly resistant surface.

Figure 6A:
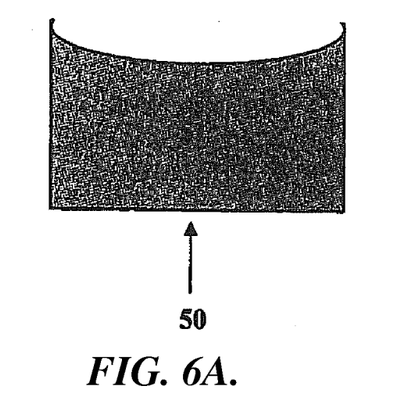
FIG. 6a shows a schematic partial cross-section view of a second substrate in the form of plastic part which serves as a reflector for a headlight.

FIG. 6a shows a substrate in the form of a plastic injection part 51, which can be used, e.g., as a reflector for a headlight. With the method according to the invention, a mirror surface can be produced directly on the surface of the plastic injection part 51, which also comprises very good corrosion properties, in particular, very good long-term stability properties, even in humid ambient conditions, and without the application of an additional protective lacquer coat. Before the method according to the invention is implemented, the plastic injection part 51 can as an option be cleaned in order to remove any separating agents or dust residues, for example, by rinsing it with water. It can also be provided that a base coat layer is first applied to the surface of the plastic injection part 51, wherein preferably, wet lacquer or wet lacquer base coats are used.

Figure 6B:
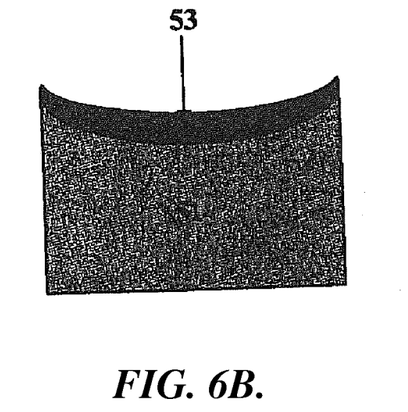
FIG. 6b shows the substrate in FIG. 6a following the application of the metal layer.
Figure 6C:
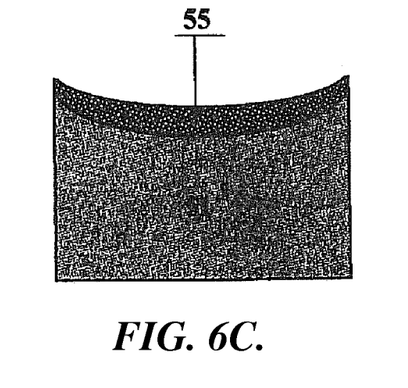
FIG. 6c shows the substrate in FIG. 6b following treatment of the metal layer with the aqueous system.

According to FIG. 6b, with the method according to the invention, an aluminium layer 53 is applied to the plastic substrate in a cathode spraying process. The thickness of this layer can be between 55 and 120 nm, for example. Equally, a surface with high quality visual properties is created on the plastic injection part 51, which has very good reflection properties, so that the reflector has very good visual properties. Depending on the plastic used for the plastic injection part 51, a heat treatment stage can be implemented after the aluminium layer 53 has been applied. In a method stage which preferably follows immediately, the substrate, as has already been described above for the metal layer 2, is treated with an aqueous system containing, e.g., an acid and/or a salt of a second metal, e.g., zirconium acid ($H_2ZrF_6$) and/or ammonium zirconium carbonate, and if appropriate, zirconium oxide and/or fluoric acid. With substrates made of plastic, the aqueous system is also applied to the metal layer under pressure via nozzles, for example under pressures of greater than 0.5 bar, so that the named compounds of the second metal are again incorporated (see also FIG. 6c). In this manner, the method according to the invention provides a reflector 50 which is both highly resilient and resistant to corrosion, while also having very good visual properties. In contrast to the reflectors made of plastic known from the prior art, no additional finishing lacquer layer is now required on the metallic protective layer.

The features of the invention disclosed in the above description, in the drawings and in the claims can be integral both individually and in any combination required in order to realise the invention in its different embodiments.

LIST OF REFERENCE NUMERALS

1 Substrate
2 Light metal wheel rim
3 Surface unevennesses
5 Base coat layer
7 Surface
9 Aluminium layer
11 Metallic layer or composite layer
13 Finishing lacquer layer
16 Line scan
50 Reflector
51 Plastic injection part
53 Aluminium layer
55 Metallic protective or composite layer

The invention claimed is:

1. A coated substrate that is at least partially corrosion protected, comprising:
   (a) a substrate; and
   (b) at least one metal composite corrosion protective layer provided on the substrate, the metal composite protective layer consisting of:
      (i) a first metal that is aluminium, lead, vanadium, manganese, magnesium, iron, cobalt, nickel, copper, titanium, or zinc; or
      (ii) a first metal alloy that is brass, bronze, stainless steel, magnesium alloy, titanium alloy, or aluminium alloy; and
      (iii) at least one oxide, double oxide, oxide hydrate, or oxyhalogenide of a second metal selected from the group consisting of zirconium, titanium, and hafnium distributed within the metal composite protective layer;
   wherein the metal composite protective layer has a thickness in the range of 20 nm to 120 nm;
   wherein providing the at least one metal composite corrosion protective layer comprises:
      (a) providing a metal layer consisting of the first metal or the first metal alloy by Physical Vapour Deposition (PVD) coating, vaporisation using an electron steam vaporiser, vaporisation using a resistance vaporiser, induction vaporisation, ARC vaporisation, and/or cathode spraying (sputter coating); and
      (b) incorporating the at least one oxide, double oxide, oxide hydrate, or oxyhalogenide of the second metal into the metal layer by treating the metal layer with an aqueous system comprising at least one acid, oxide, double oxide, oxide hydrate, oxyhalogenide or salt of the second metal.

2. The coated substrate of claim 1, wherein a surface of the substrate that bears the metal composite protective layer is an at least partially polished, ground, de-greased, or pickled surface.

3. The coated substrate of claim 1, wherein the oxide, double oxide, oxide hydrate, or oxyhalogenide of the second metal in the metal composite protective layer, in relation to its overall weight, lies in the range of 0.2% to 10% by weight.

4. The coated substrate of claim 1, wherein the thickness of the metal composite protective layer lies in the range of 20 nm to 100 nm.

5. The coated substrate of claim 1, wherein the thickness of the metal composite protective layer lies in the range of 50 nm to 120 nm.

6. The coated substrate of claim 1, wherein the substrate is formed from metals, precious metals or metal alloys, glass, ceramic, carbon materials, plastic material, wood, or chipboard.

7. The coated substrate of claim 1, wherein oxidically bound titanium, zirconium, hafnium, or a mixture thereof is present in the metal composite protective layer.

8. The coated substrate of claim 1, wherein the oxide, double oxide, oxide hydrate, or oxyhalogenide of the second metal selected from the group consisting of zirconium, titanium, and hafnium is distributed in the metal composite protective layer over essentially the entire thickness of the metal composite protective layer of the first metal or the first metal alloy.

9. The coated substrate of claim 1, wherein the oxide, double oxide, oxide hydrate, or oxyhalogenide of the second metal selected from the group consisting of zirconium, titanium, and hafnium is essentially evenly distributed in the metallic composite protective layer.

10. The coated substrate of claim 1, wherein the substrate is an aluminium substrate, and the metal composite protective layer is an aluminium layer in which oxidically bound titanium, zirconium, hafnium, or a mixture thereof is distributed.

11. The coated substrate of claim 10, wherein the substrate is an aluminium substrate, and the metal composite protective layer comprises an aluminium layer in which zirconium dioxide is present and substantially evenly distributed.

12. The coated substrate of claim 1, wherein a cover lacquer layer or glaze is applied directly on the metal composite protective layer.

13. The coated substrate of claim 1, further comprising at least one base coat layer intermediate the substrate and the metal composite protective layer.

14. The coated substrate of claim 1, wherein the metal layer is provided by Physical Vapour Deposition (PVD) coating, vaporisation using an electron stream vaporiser, vaporisation using a resistance vaporiser, induction vaporisation, ARC vaporisation, and/or cathode spraying (sputter coating), in each case in a high vacuum.

* * * * *